United States Patent [19]

Matsushima et al.

[11] Patent Number: 4,780,759

[45] Date of Patent: Oct. 25, 1988

[54] SAMPLING CLOCK GENERATION CIRCUIT OF VIDEO SIGNAL

[75] Inventors: Kenichi Matsushima; Fumihiro Tanaka; Yoshio Shimada; Kaneo Yamaguchi; Shinya Watanabe, all of Tokyo, Japan

[73] Assignee: Seiko Instruments & Electronics Ltd., Tokyo, Japan

[21] Appl. No.: 912,945

[22] Filed: Sep. 29, 1986

[30] Foreign Application Priority Data

Oct. 1, 1985 [JP] Japan .................................. 60-218232

[51] Int. Cl.⁴ ......................... H04N 7/08; H04N 7/093
[52] U.S. Cl. .................................... 358/148; 358/158; 358/325; 331/20; 375/120
[58] Field of Search ............... 358/148, 150, 152, 158, 358/264, 319, 320, 325, 337; 340/814; 375/111, 118, 119, 120; 331/20

[56] References Cited

U.S. PATENT DOCUMENTS

| | | | |
|---|---|---|---|
| 4,253,116 | 2/1981 | Rogers, III | 358/158 |
| 4,496,977 | 1/1985 | Ikeda | 358/148 |
| 4,567,522 | 1/1986 | Stroomer et al. | 331/20 |

*Primary Examiner*—James J. Groody
*Assistant Examiner*—Michael D. Parker
*Attorney, Agent, or Firm*—Bruce L. Adams; Van C. Wilks

[57] ABSTRACT

A recording apparatus receives a video signal containing a horizontal sync signal and a data signal comprised of a given number of image bit data arranged within each horizontal scanning period, and stores the number of image bit data in synchronization with the horizontal sync signal. A voltage-controlled oscillator produces in synchronization with the horizontal sync signal a frequency signal having a frequency higher than that of the sync signal. A divider frequency-divides the frequency signal by a given factor to produce a number of sampling pulses corresponding to the given number of image bit data. A data sampling circuit receives the data signal for sampling therefrom the number of image bit data in response to the corresponding sampling pulses to thereby write the image bit data into memory. Another divider frequency-divides the frequency signal by the product of the given factor and the given number to produce a feedback signal. A comparator compares the phase of the feedback and sync signals with each other to produce a control signal effective to maintain the VCO to continuously produce the frequency signal synchronized with the horizontal sync signal.

11 Claims, 8 Drawing Sheets

PRIOR ART
FIG. 2

SAMPLING CLOCK GENERATION CIRCUIT OF VIDEO SIGNAL

BACKGROUND OF THE INVENTION

1. Field of the invention

This invention relates to a sampling clock generation circuit for accurately sampling image data assigned to each display and contained in a video signal in a recording apparatus which receives the video signal and records the image data.

2. Description of the Prior Art

Figure 6:
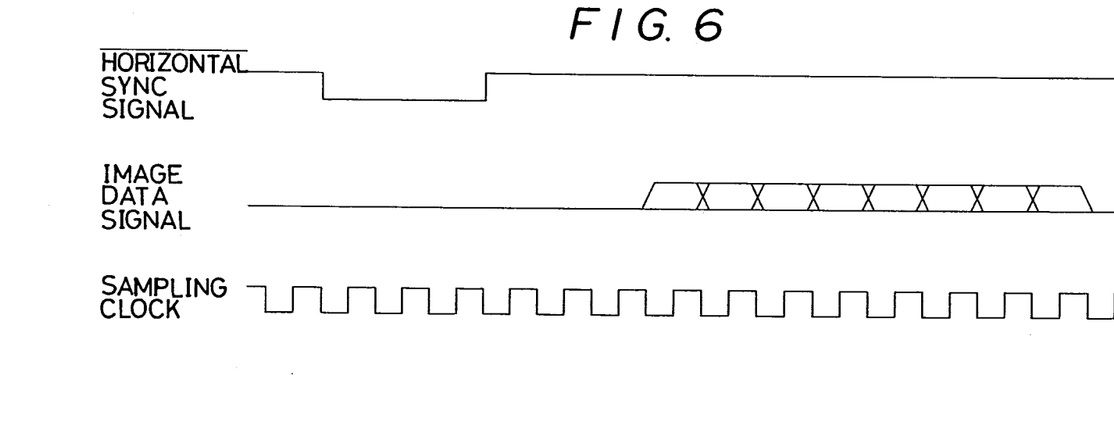
FIG. 6 is a timing chart of a sampling clock.

Accuracy and resolution of image display devices in recent CAD.CAM applications have been improved, and recording apparatuses used for such applications must reproduce the displayed image with a high level of fidelity. In order to particularly attain high fidelity recording of graphic display by use of video signals as a medium, sampling of the image data by use of clocks on the one-to-one correspondence basis must be ensured for pixels. Since the image data signal of each pixel is in synchronism with a horizontal sync signal as shown in FIG. 6 of the accompanying drawings, the sampling clock must be in synchronism with the horizontal sync signal, too. For this reason, the sampling clock in the conventional apparatuses is generated by an oscillation circuit which oscillates at the same frequency as the video signal, and only the phase is controlled by a PLL circuit using a variable delay circuit with the horizontal sync signal being the reference.

Figure 2:
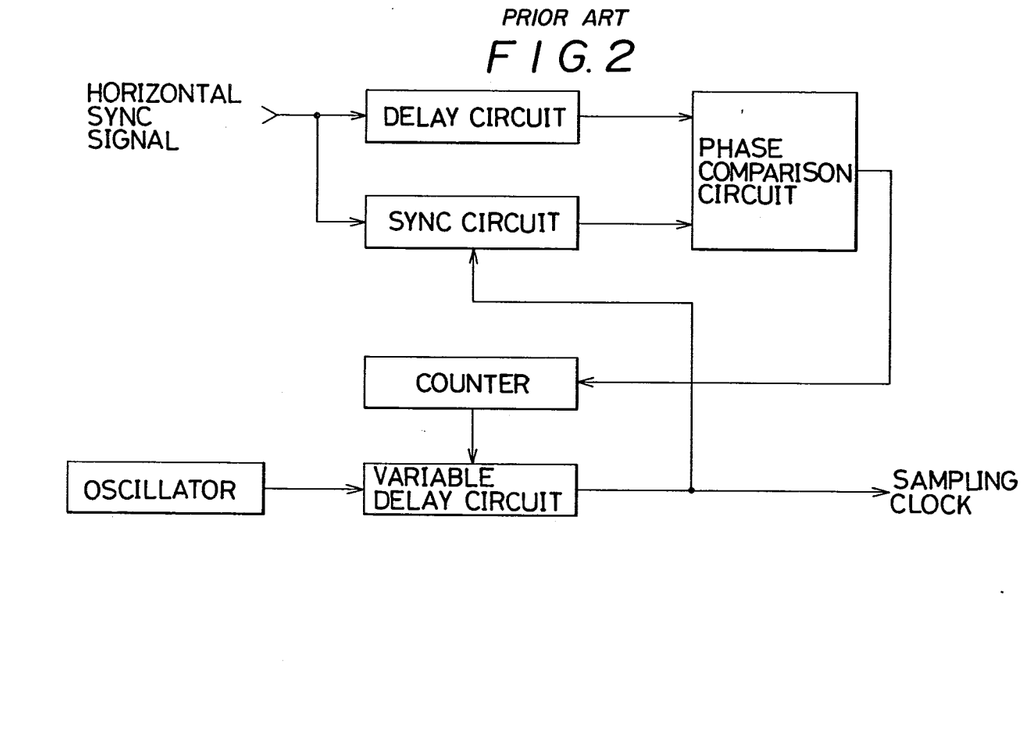
FIG. 2 is a block diagram of one example of the conventional sampling clock generation circuits.

An example of the conventional sampling clock generation circuits will be explained with reference to FIG. 2.

The conventional sampling clock generation circuit consists of a portion which compares the phase of a horizontal sync signal synchronized by a sampling clock with that of a delayed horizontal sync signal and detects the phase difference of the sampling clock with respect to the horizontal sync signal, and a portion which controls the phase of the output signal of an oscillation circuit oscillating at the same frequency as that of a video signal by a variable delay circuit. When the phase advance of the sampling clock is detected, the delay quantity of the variable delay circuit is changed so as to delay the phase of the sampling clock, and when the phase delay of the sampling clock is detected, the delay quantity of the variable delay circuit is changed so as to advance the phase of the sampling clock. In this manner, the sampling clock capable of accurately sampling the image data of each pixel contained in the video signal is generated by adjusting the phase of the sampling clock to that of the horizontal sync signal as the reference.

When the difference of frequency is great between the oscillation frequency of the oscillation circuit and the video signal, the conventional method described above cannot control the phase because the phase is deviated within one horizontal period and accurate sampling cannot be made any longer so that the range of an allowable video signal frequency is narrow, and moreover, a high precision oscillation circuit has been necessary.

Furthermore, since the variable delay circuit selects output signals having different delay quantities of delay elements and changes the delay quantity, the delay quantity can be controlled only discretely. For this reason, the phase error of the sampling clock is great and high precision delay elements have been necessary.

Hence, the conventional method described above is applied to several 10 MHz of video signal frequency at most. On the contrary, higher resolution and multi-color of image display devices in recent CAD.CAM applications have required to deal with over 100 MHz of video signal frequency. Accordingly, the cost has become problem on account of needs of higher precision components.

SUMMARY OF THE INVENTION

It is therefore an object of this invention to provide a sampling clock generation circuit which accurately sample the video signals in a wide frequency range.

Figure 3:
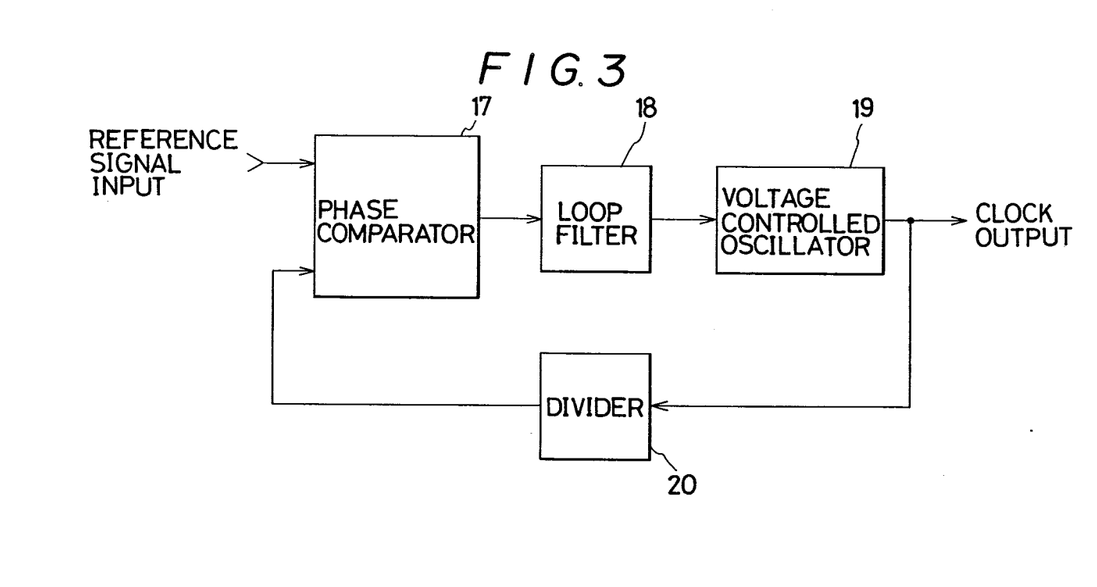
FIG. 3 is a block diagram of a PLL circuit used in the present invention.

In order to solve problems mentioned above, the present invention employs a known PLL circuit with a built-in voltage controlled oscillator (hereinafter referred to VCO) such as shown in FIG. 3. (U.S. Pat. No. 3,610,954 issued Oct. 5, 1971 to Ronald L. Treadway)

In other words, the phase comparison circuit compares the signal prepared by frequency-dividing the sampling clock by the video signal clock number of one horizontal period with the horizontal sync signal at the leading edge thereof or the composite sync signal as the reference. The operation of the phase comparison circuit is inhibited while the vertical sync signal is inputted, and the frequency division circuit capable of changing the frequency division ratio is connected to the output of VCO.

In the sampling clock generation circuit of the image data of each pixel contained in the video signal having the construction described above, a sampling clock having a frequency which is the multiple of the frequency of the horizontal sync signal multiplied by the clock number of the video signal of one horizontal period is generated, the video signal frequency and the frequency of the sampling clock can be equalized with each other in a wide frequency range, and at the same time, the phase of the sampling clock can be synchronized with that of the horizontal sync signal.

Figure 5:
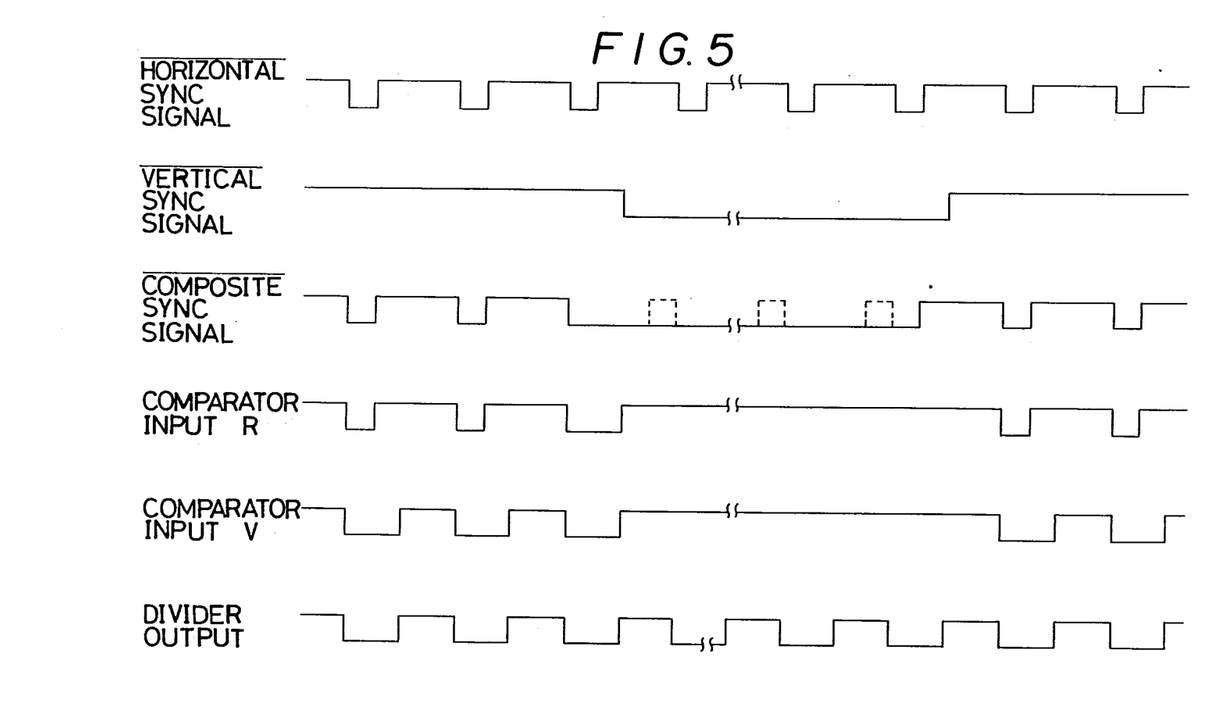
FIG. 5 is a timing chart of the phase comparison circuit shown in FIG. 1.

In addition, the operation of the phase comparison circuit is inhibited during the input of the vertical sync signal, and the phase comparison is made at the leading edge of the horizontal sync signal, so that even when a composite sync signal of a composite video signal such as shown in FIG. 5 is used as the reference input signal the, phase detection can be made accurately and the sampling clock can be generated stably.

Furthermore, since the frequency division circuit is disposed at the output of VCO, the sampling clock having the frequency which is obtained by frequency-dividing the frequency signal oscillated by VCO can be generated and the range of the corresponding video signal frequency can be further expanded.

DETAILED DESCRIPTION OF THE PREFERRED EMBODIMENTS

Hereinafter, one embodiment of the present invention will be described with reference to the accompanying drawings.

Figure 1:
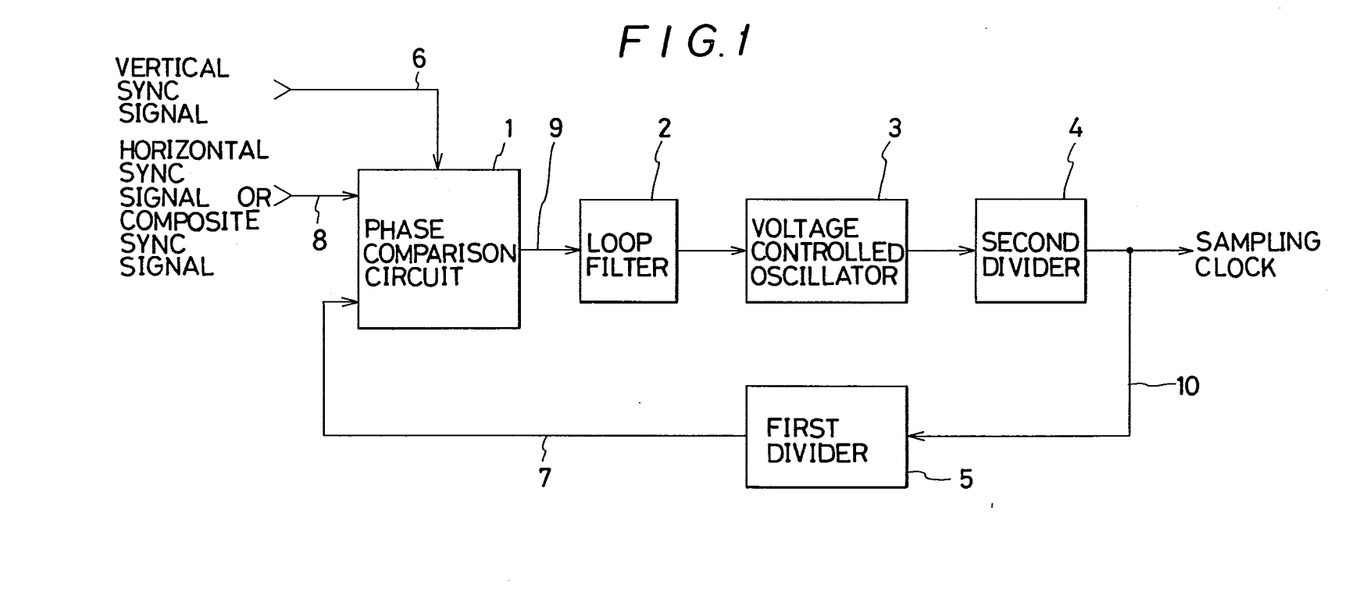
FIG. 1 is a block diagram of a sampling clock generation circuit in accordance with one embodiment of the present invention.
Figure 4:
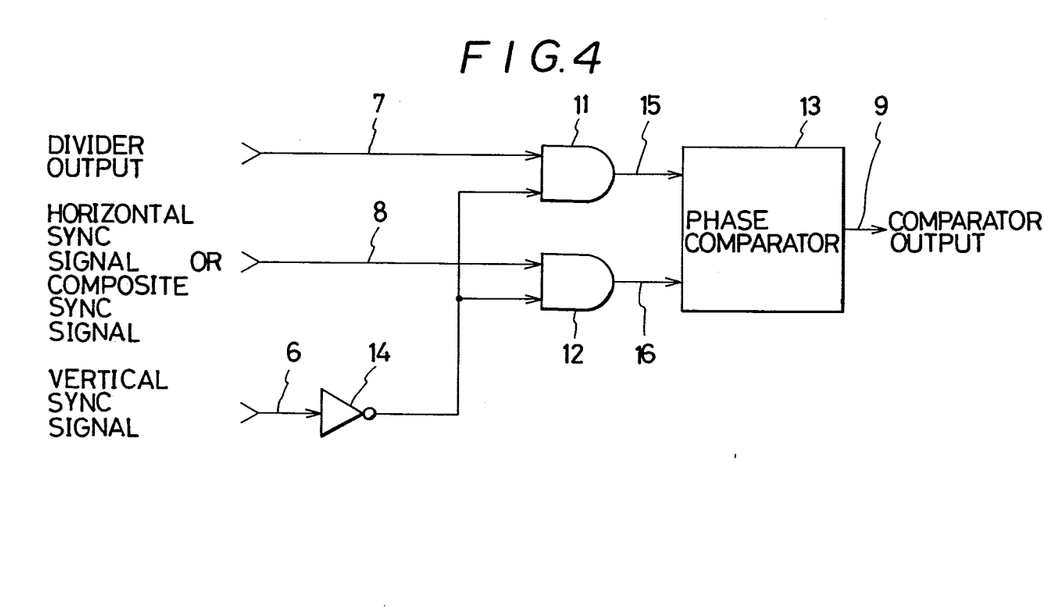
FIG. 4 is a detailed block diagram of the phase comparison circuit 1 shown in FIG. 1.

In FIG. 1, a phase comparison circuit 1 has a construction such as shown in FIG. 4. Namely, input signals 7 and 8 of a phase comparator 13 is applied to gates 11, 12 and when a vertical sync signal 6 is inputted thereto, phase comparison is inhibited. This is because composite sync signals of video signals of the composite type vary with display devices, and some composite signals are devoid of the horizontal sync signal at the time of input of the vertical sync signal while other composite signals have a timing different from an ordinary timing as shown in the timing chart of FIG. 5. In such a case, too, a frequency division signal 7 is inhibited and turned into a comparison input signal v 15 by the gate 11 while the horizontal sync signal or the composite sync signal 8 is inhibited and turned into a comparison input signal R 16 by the gate 12, so that the timing at the leading edge of the comparison input signal R fed to the phase comparator 13 in always coincides with that of the comparison input V and the comparison can be made stably.

The phase comparator 13 shown in FIG. 4 and a loop filter 2 and VCO 3 shown in FIG. 1 are equivalent to the phase comparator 17, loop filter 18 and VCO 19 of a known PLL circuit shown in FIG. 3.

Figure 1A:
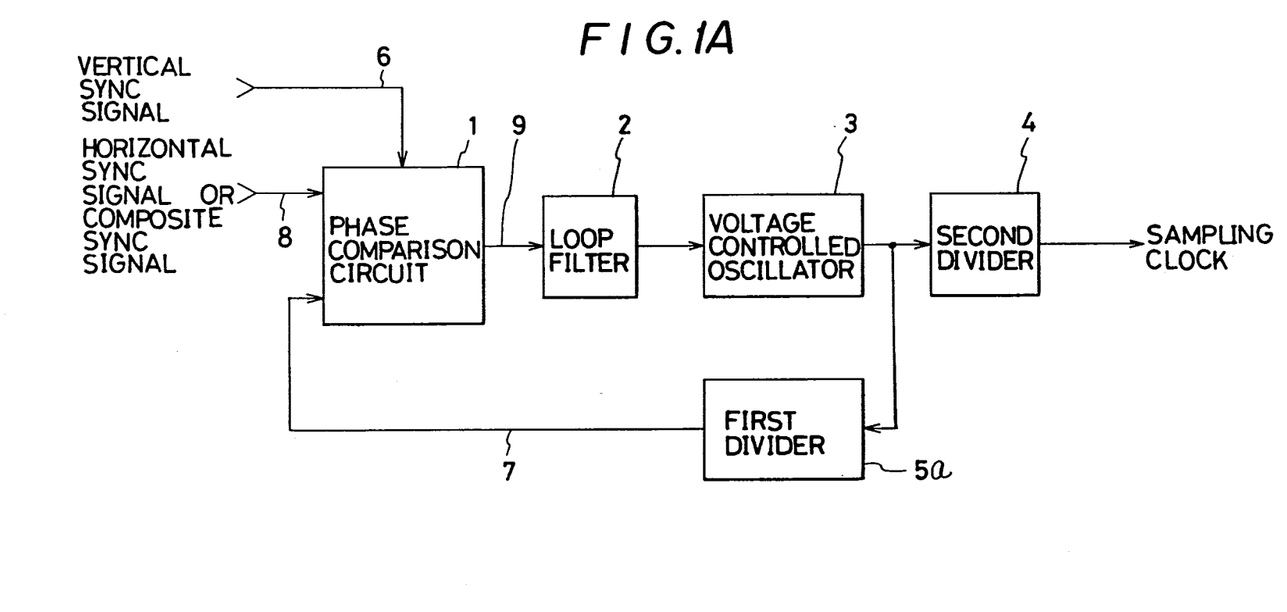
FIG. 1A is a block diagram of a sampling clock generation circuit in accordance with another embodiment of the present invention.

The second frequency division circuit 4 shown in FIG. 1 can output or generate a sampling clock signal having a frequency lower than that of the oscillation frequency of VCO by dividing the frequency of the output frequency signal of VCO. The second frequency division circuit 4 uses a programmable counter capable of changing the frequency division ratio or factor in order to drastically expand the range of the frequency of the video signal to which the VCO can respond. Though the second frequency division circuit 4 is disposed in the loop of the PLL circuit in FIG. 1, the second frequency division circuit 4 may be disposed outside the loop of the PLL circuit as shown in FIG. 1A so that the second frequency division circuit 4 can divide the frequency of the output of the loop of the PLL circuit at the output of VCO. Two frequency division circuits may also be disposed inside and outside the loop of the PLL circuit, respectively.

The first frequency division circuit 5 shown in FIG. 1 divides the frequency of the sampling clock 10 and converts it to a frequency divided feedback signal 7 having the same frequency as that of the horizontal sync signal. The first frequency division circuit 5 uses a programmable counter so as to change the frequency division ratio, and sets the clock number of the video signal of one horizontal period as the frequency division ratio. In another embodiment, as shown in FIG. 1A, when the second frequency division circuit 4 is disposed outside the loop of the PLL circuit, the frequency division ratio of a first frequency division circuit 5a connected to receive the output of the VCO3 may be set to the product of the number image bit data contained in the video signal and arranged within one horizontal period and the frequency division factor of the second frequency division circuit 4 disposed outside the loop.

In the manner described above, the PLL circuit is improved and applied to the generation circuit for generating the clock for sampling the image data of each pixel contained in the video signal. Thus, the sampling clock having the frequency which is the product of the frequency of the horizontal sync signal and the clock number of the video signal of one horizontal period and having the pahse which is synchronized with that of the horizontal sync signal can be generated not only when the horizontal sync signal of the video signal of the separate type is used as the reference input signal but also when the composite sync signal of the video signal of the composite type is used.

Figure 7:
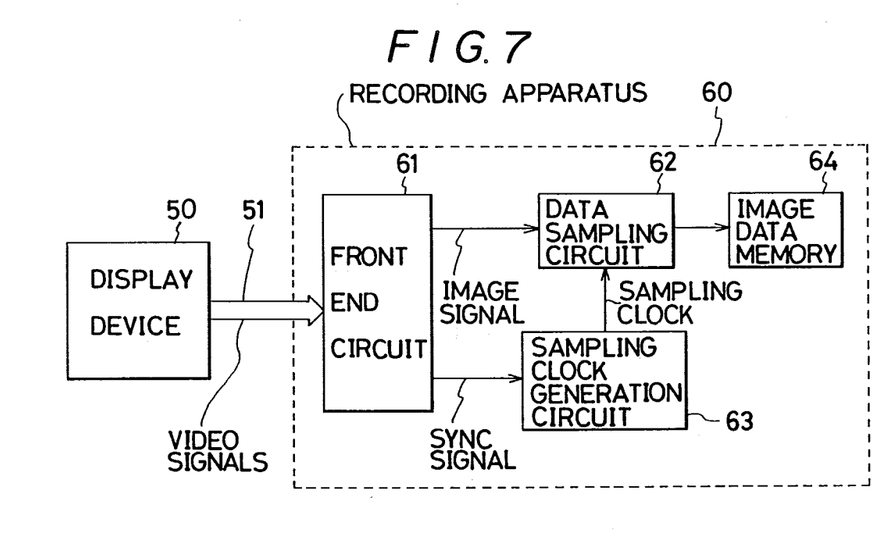
FIG. 7 is a circuit block diagram including a display device and a recording apparatus.

The above mentioned sampling clock generation circuit in accordance with this invention is included in a recoding apparatus as shown in FIG. 7. FIG. 7 shows a recoding apparatus 60 for receiving video signals 51 containing image data from a display device 50 and recoding the image data. A sampling clock generation circuit 63 is comprised of a phase comparison circuit 1 having first, second and third terminals, a loop filter 2 connected to the output terminal of the phase comparison circuit 1, a voltage controlled oscillator 3 connected to the output terminal of the loop filter 2 for generating a frequency signal, a second frequency divider 4 connected to the output terminal of the voltage controlled oscillator 3 for generating a sampling clock to sample the video signals, and a first requency divider 5 connected to the output terminal of the second frequency divider 4 and the first input terminal of the phase comparison circuit 1. The phase comparison circuit 1 receives a horizontal sync signal or a composite sync signal 8 at the second input terminal thereof, and receives a vertical sync signal 6 at the third input terminal thereof.

As described above, the present invention provides the effects that the sampling clock for sampling accurately the data of each pixel contained in the separate type or composite type video signal having a wide frequency range is generated, the allowable range of the video signal frequency can be expanded drastically, the phase error of the sampling clock can be reduced, and high precision oscillation circuit and delay elements become unnecessary.

What is claimed is:

1. In a recording apparatus for receiving video signals containing image bit data from a display device and recording said image bit data in response to sampling clock pulses, a sampling clock generation circuit comprising: a phase comparison circuit for receiving horizontal sync signals or composite sync signals; a loop filter for receiving output signals of said phase comparison circuit; a VCO for receiving output signals of said loop filter; a first frequency divider for receiving output signals of said VCO and providing output signals to said phase comparison circuit; and a second frequency divider for receiving output signals of said VCO and for generating sampling clock pulses, said first frequency divider having a frequency division ratio which is the product of a given number of the image bit data contained in the video signal within one horizontal period and the frequency division ratio of said second frequency divider.

2. A recording apparatus according to claim 1, wherein said first frequency divider and said second frequency divider are variable in frequency division ratio.

3. In a recording apparatus having dividing means receptive of a video signal from an external display device for dividing the video signal into a sync signal having a frequency effective to determine successive horizontal scanning periods and a data signal containing a given number of image bit data arranged within each horizontal scanning period, and storing means for storing the number of image bit data in synchronization with the sync signal: producing means for producing in synchronization with the sync signal a frequency signal having a frequency higher than that of the sync signal; output means receptive of the frequency signal for frequency-dividing the same by a given factor to produce a sampling signal having a number of pulses arranged within each horizontal scanning period and corresponding to the given number of image bit data; sampling means receptive of the divided data signal for sampling therefrom the number of image bit data in response to the corresponding pulses of sampling signal to thereby write the image bit data into the storing means, feedback means receptive of the frequency signal for frequency-dividing the same by the product of the given factor and the given number to produce a feedback signal; and comparing means receptive of the feedback and sync signals for comparing the phases thereof with each other to produce a control signal effective to maintain the producing means to continuously produce the frequency signal synchronized with the sync signal.

4. A recording apparatus according to claim 3, wherein the output means includes setting means for setting a given factor.

5. A recording apparatus according to claim 4; wherein the setting means comprises a programmable counter.

6. A recording apparatus according to claim 3; wherein the feedback means includes setting means for setting a frequency-division rate to the product of the given factor and the given number.

7. A recording apparatus according to claim 6; wherein the setting means comprises a programmable counter.

8. A recording apparatus according to claim 3; wherein the producing means comprises a voltage-controlled oscillator for producing a frequency signal according to a control voltage signal.

9. A recording apparatus according to claim 8; wherein the comparing means comprises a phase comparison circuit for producing a control voltage signal according to the phase difference between the sync and feedback signals.

10. A recording apparatus according to claim 3; wherein the comparing means includes receiving means for receiving a composite sync signal containing vertical and horizontal sync signal components.

11. A recording apparatus according to claim 10; wherein the receiving means includes means for inhibiting the phase comparison when the vertical sync signal component is received.

* * * * *